United States Patent
Tsai

(12) United States Patent
(75) Inventor: Chao-Chieh Tsai, Taichung (TW)
(73) Assignee: Taiwan Semiconductor Manufacturing Company, Hsin-Chu (TW)
( * ) Notice: Subject to any disclaimer, the term of this patent is extended or adjusted under 35 U.S.C. 154(b) by 0 days.

(54) STI PROCESS

(21) Appl. No.: 09/307,841
(22) Filed: May 10, 1999
(51) Int. Cl.⁷ .................................................. H01L 21/76
(52) U.S. Cl. ........................ 438/421; 438/424; 438/443
(58) Field of Search ............................... 438/421, 424, 438/443

(56) References Cited

U.S. PATENT DOCUMENTS

| | | | |
|---|---|---|---|
| 5,118,641 | 6/1992 | Roberts | 437/69 |
| 5,393,694 | 2/1995 | Mathews | 437/72 |
| 5,672,538 | 9/1997 | Liaw et al. | 437/69 |
| 5,686,346 | 11/1997 | Duane | 437/69 |
| 5,712,185 | 1/1998 | Tsai et al. | 437/67 |
| 5,821,153 | 10/1998 | Tsai et al. | 438/439 |
| 5,956,598 | * 9/1999 | Huang et al. | |

* cited by examiner

*Primary Examiner*—John F. Niebling
*Assistant Examiner*—Josetta Jones
(74) *Attorney, Agent, or Firm*—George O. Saile; Stephen B. Ackerman

(10) Patent No.: US 6,245,637 B1
(45) Date of Patent: Jun. 12, 2001

(57) ABSTRACT

STI is sometimes effected by etching back shallow trenches that have been over-filled with oxide in order to make the upper surfaces co-planar with the semiconductor. This results in the formation of a groove at the oxide-semiconductor interface which exposes the source/drain PN junction, making it vulnerable to shorting during subsequent SALICIDE processes. In the present invention, manufacture of the LDD device proceeds in the normal way except that when silicon nitride spacers are grown on the vertical sides of the gate pedestal, the depositing silicon nitride is also allowed to coat the exposed vertical walls of the trenches (i.e. inside the groove). Following standard practice, a layer of pad oxide is interposed between the trench wall and this additional silicon nitride for purposes of stress relief.

20 Claims, 2 Drawing Sheets

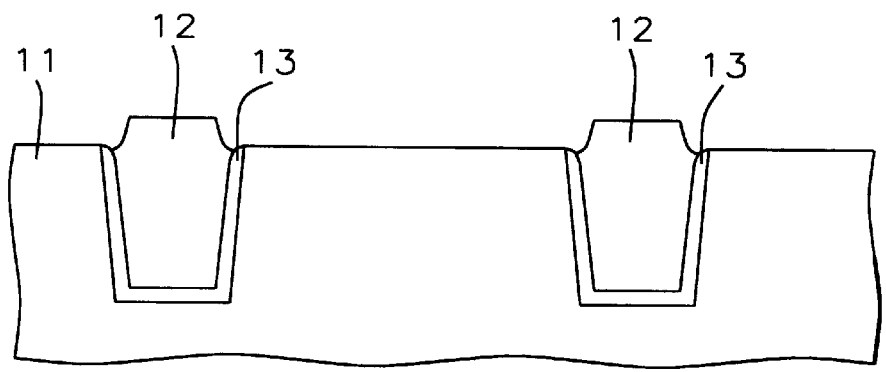
FIG. 1 – Prior Art
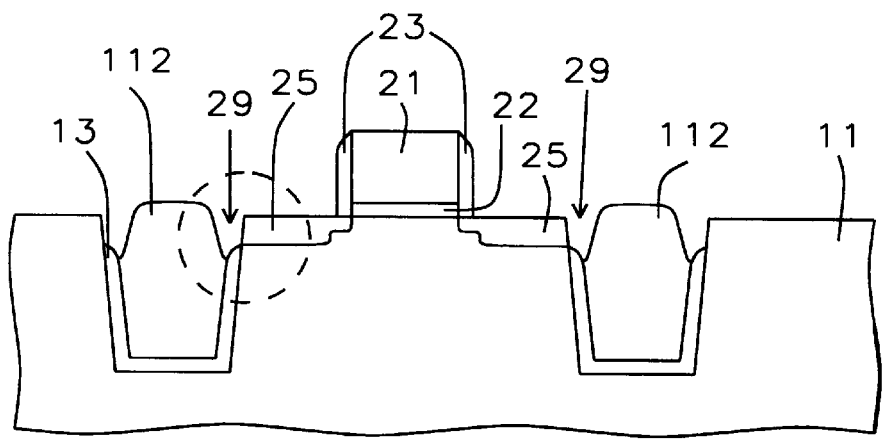
FIG. 2 – Prior Art
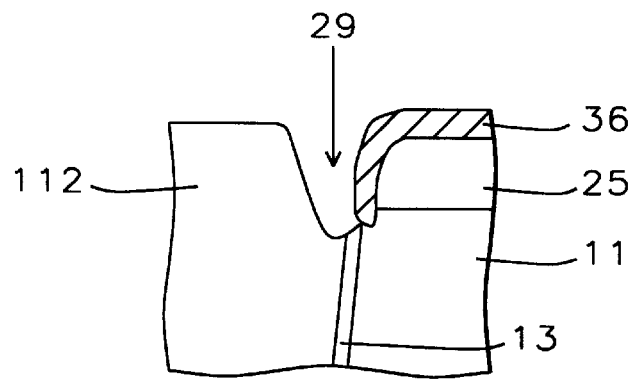
FIG. 3 – Prior Art

STI PROCESS

FIELD OF THE INVENTION

The invention relates to the general field of semiconductor manufacture, more particularly to the SALICIDE and STI processes, with particular attention to the problem of preventing junction leakage at the source and drain.

BACKGROUND OF THE INVENTION

To avoid leakage between devices and latchup problems within a device, it is necessary to provide electrical isolation both between and within devices. For many years this was accomplished by means of LOCOS (Local Oxidation of Silicon). In this process, thick layers of oxide were grown on the silicon surface in selected areas. These oxide layers extended both below as well as above the silicon surface and had a relatively gentle slope where they met the silicon surface. This sloped interface limited the device densities that could be achieved in an integrated circuit.

Significant improvement in device densities can be achieved if LOCOS is replaced by STI (shallow trench isolation). In the latter process, trenches having relatively steep sidewalls are first etched into the silicon and are then filled with dielectric, usually silicon oxide deposited by CVD (chemical vapor deposition). Since the top surface of the filler material is co-planar with the silicon surface, formation of fine wiring running across both surfaces does not present any problems.

To understand the problem that is addressed by the present invention we refer now to FIG. 1. Shown there are a pair of trenches, in silicon body 11, that have been over-filled with dielectric material (silicon oxide) 12. Lining the walls of the trenches is layer 13 of thermal oxide which has been included to remove defects resulting from the trench etch. Over-filling is necessary to guarantee that inadvertent under-filling does not occur and also to provide a passivation layer for the silicon side wall.

During the removal of the silicon nitride as well as in subsequent process steps such as HF cleaning, spacer etching, etc., as illustrated in FIG. 2, grooves such as 29 are formed at the interface between the filler dielectric 112 and the silicon 11. As the sidewalls of the trenches become steeper (in order to achieve greater device densities), this problem becomes more common. In many cases (particularly when the sidewalls depart from the vertical by less than about 78 degrees) such grooves may be deep enough to expose the PN junction between source/drain regions 25 and the main silicon body 11. Said junctions were formed as part of a self-aligned LDD (lightly doped drain) process in which polysilicon gate 21, over gate oxide layer 22, served as its own mask during ion implantation. The latter process was performed in two steps, once before and once after the formation of spacers 23 on the sidewalls of 21, giving regions 25 their characteristic stepped appearance.

Of itself, the exposure of the junction is not a serious problem. However, once the structure shown in FIG. 2 has been formed, the next step in the process is to make separate, non touching, contacts to the gate pedestal and to the source/drain regions. This is most widely accomplished by means of the SALICIDE (self-aligned silicide) process in which a layer of a silicide forming metal, such as cobalt, is deposited over the entire structure and then briefly heated. Wherever the metal is in direct contact with silicon, the silicide is formed and the metal remains unreacted elsewhere. A selective etch then removes all unreacted metal, leaving the silicide (which is a good conductor) in place as a contacting medium where needed and absent where it is not wanted. In particular, it is not present over the spacers 23.

The consequences of exposing an edge of the source/drain junction are illustrated in FIG. 3 which is an enlarged view of the portion of FIG. 2 enclosed in the broken circle. Silicide layer 36 is seen to have been grown on the upper surface of 25, as intended. However, because of the exposure, in groove 29, of the surface at the edge of the junction between 25 and 11, silicide has grown there too. This represents a serious problem since layer 36 now acts to short circuit the PN junction. The present invention is dedicated to solving this problem.

A routine search of the patent literature was conducted but no references that approach the problem in the manner taught by the present invention were found. Several references of interest were, however, encountered. For example, Tsai et al. (U.S. Pat. No. 5,821,153) describe a similar problem, namely the presence of a gap at the edge of field oxide formed by LOCOS. They solve this problem by growing a protective coating of silicon oxynitride around the field oxide. In Duane (U.S. Pat. No. 5,686,346), nitride over oxide is described as a means for reducing the natural encroachment of field oxide into the active area. The patent teaches removal of this additional layer of nitride after devices have been formed.

Roberts (U.S. Pat. No. 5,118,641) also limits the total encroachment of field oxide. He deliberately makes the FOX too small, leaving some of the silicon exposed, then protects this exposed silicon with silicon nitride. The silicon nitride does not cover any exposed P-N junctions in this method. Liaw et al. (U.S. Pat. No. 5,672,538) note that the vertical edges of field oxide, formed by LOCOS and projecting above the silicon surface, can be rather steep and thus likely to degrade the integrity of metal lines subsequently deposited over it. Their patent teaches how this edge may be rendered less steep.

Mathews (U.S. Pat. No. 5,393,694) describes a problem similar to that solved by the present invention but provides a different solution. The groove is over-filled with polysilicon, then planarized, and then steam oxidized to convert it to silicon oxide so that the trench becomes uniformly filled with silicon oxide and the groove, in effect, disappears. Tsai et al. (U.S. Pat. No. 5,712,185) use silicon nitride as part of a shallow isolation trench formation process. This silicon nitride is no longer present after the final structure has been formed.

SUMMARY OF THE INVENTION

It has been an object of the present invention to provide a process for shallow trench isolation.

A further object of the present invention has been that trenches formed through said process not lead to possible junction shorting after a SALICIDE process.

Another object of the invention has been that said process require little or no change to processes normally used for the manufacture of an LDD field effect device.

These objects have been achieved by etching back over-filled shallow trenches in order to make their upper surfaces co-planar with the semiconductor, which results in the formation of a groove at the oxide-semiconductor interface. Manufacture of the LDD device then proceeds in the normal way except that when silicon nitride spacers are grown on the vertical sides of the gate pedestal, the depositing silicon nitride is also allowed to coat the exposed vertical walls of the trenches (i.e. in the groove). Following standard practice, a layer of pad oxide is interposed between the trench wall and the additional silicon nitride for purposes of stress relief.

BRIEF DESCRIPTION OF THE DRAWINGS

FIG. 1 is a cross-section of two shallow trenches that have been over-filled with dielectric material.

FIG. 2 shows a completed field effect transistor of the LDD type positioned between two shallow trenches and illustrating how a groove has been formed at the interface between the dielectric filler and the semiconductor.

FIG. 3 is a close-up view of the groove seen in FIG. 2, following a SALICIDE process, showing how the source/drain junction may be shorted out.

DESCRIPTION OF THE PREFERRED EMBODIMENTS

Figure 4:
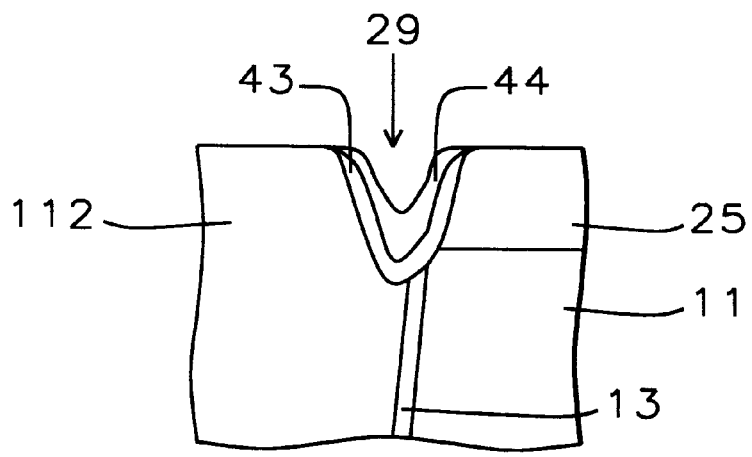
FIG. 4 illustrates how the groove seen in FIG. 2 may be protected from exposure during a subsequent SALICIDE process.

We begin our description of the process of the present invention by returning briefly to FIG. 1. We note that this description is presented in terms of an N channel device but it will be understood by those skilled in the art that a P channel device could equally well have been used for this purpose.

The process starts with a P type semiconductor (usually silicon) body 11 (a P type wafer or a P-well within an N type body) in whose upper surface shallow trenches are formed (using standard photolithographic techniques). These trenches typically have a width greater than about 0.2 microns and a depth between about 0.3 and 0.4 microns and are separated one from another by a minimum distance of between about 0.2 and 0.3 microns. In general, the side walls of these trenches will be nearly vertical, sloping away from the vertical by no more than about 78 degrees.

Once formed, these trenches are overfilled with a dielectric material such as silicon oxide (most commonly deposited by CVD) 12 which is then etched (50:1 HF for 5 minutes at room temperature) until it has a surface that is co-planar with the silicon. This etching procedure results in the formation of groove 29 (see FIG. 2) at the interface between silicon oxide 12 and silicon 11. Typically, the groove would have a depth between about 0.3 and 0.4 microns.

Next, a layer of gate oxide 22 is grown on the surface of 11, following which layer 21 of polysilicon (between about 1.8 and 2.5 microns thick) is deposited over the gate oxide. Under a suitable mask, the polysilicon and gate oxide are etched to form polysilicon gate pedestal 21 (having a width that is greater about 0.1 microns) which is positioned midway between, for example, the two filled shallow trenches seen in FIG. 2.

Formation of the source and drain regions 25 follows. This is achieved by implanting a first layer of donor ions into the silicon body, with pedestal 21 acting as its own mask.

Next, in a key departure from the prior art (and referring to FIG. 4), a layer of pad oxide 43, having a thickness between about 50 and 100 Angstroms, is grown inside groove 29 as a stress relief buffer. Then, silicon nitride layer 44 is selectively deposited, to a thickness between about 600 and 1,800 Angstroms, on all vertical surfaces so that spacers 23 (FIG. 2) are formed on the layer of pad oxide 43 as layer 44 (FIG. 4) as well as on the vertical surfaces of the pedestal. Deposition of the silicon nitride was accomplished by means of PECVD (Plasma Enhanced Chemical Vapor Deposition).

Figure 5:
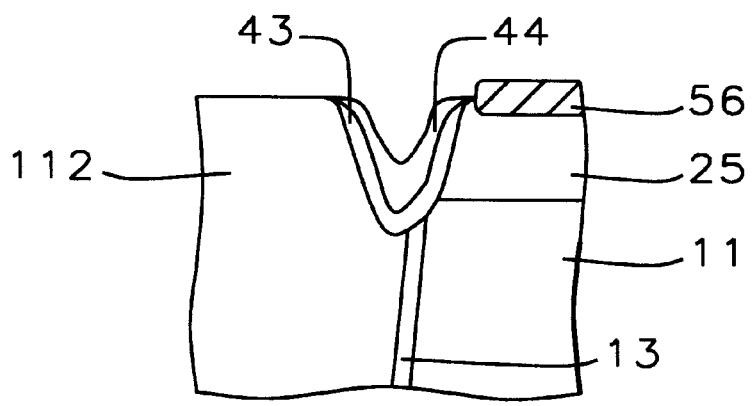
FIG. 5 is the structure of FIG. 4 after SALICIDE, showing that the suicide layer does not extend as far as the junction

A second layer of donor ions is then implanted, this second layer being deeper and more heavily doped than the first layer, thereby completing the formation of source and drain regions 25 and placing the structure in readiness for application of the SALICIDE processed, as discussed above. This involves depositing a layer of a suicide forming metal such as cobalt, although other metals such as titanium or tungsten could also have been used. A rapid thermal anneal follows (between about 450 and 600° C. for between about 10 and 15 minutes). This allows the silicide to form wherever the metal is in direct contact with silicon, a portion of which is seen as layer 56 in FIG. 5. As a result, once all unreacted metal has been selectively etched away, proper contacts to the gate and the source/drain will have been established and there is no suicide present across the junction between 25 and 11.

While the invention has been particularly shown and described with reference to the preferred embodiments thereof, it will be understood by those skilled in the art that various changes in form and details may be made without departing from the spirit and scope of the invention.

What is claimed is:

1. A process for shallow trench isolation, comprising:

forming a shallow trench in a surface of a semiconductor body;

over-filling said trench with dielectric material;

etching the dielectric material until it has a surface that is co-planar with said semiconductor surface, thereby forming a groove located between the dielectric and the semiconductor;

growing, inside said groove, a layer of pad oxide; and depositing a layer of silicon nitride over the layer of pad oxide.

2. The process of claim 1 wherein the layer of pad oxide has a thickness between about 50 and 100 Angstroms.

3. The process of claim 1 wherein the layer of silicon nitride has a thickness between about 600 and 1,800 Angstroms.

4. The process of claim 1 wherein the trench has a width that is greater than about 0.2 microns.

5. The process of claim 1 wherein the trench has a depth between about 0.3 and 0.4 microns.

6. The process of claim 1 wherein the groove has a depth between about 500 and 1,000 Angstroms.

7. The process of claim 1 wherein the step of etching the dielectric material further comprises using 50:1 HF for 5 minutes at room temperature.

8. The process of claim 1 wherein the step of depositing a layer of silicon nitride further comprises using PECVD.

9. A process to reduce junction leakage after a SALICIDE process, comprising:

providing a body of P type silicon;

forming shallow trenches in a surface of said silicon body, said trenches having side walls that slope away from vertical by no more than about degrees;

over-filling the trenches with silicon oxide;

growing a layer of gate oxide on the silicon surface;

depositing a layer polysilicon on the gate oxide;

under a suitable mask, etching the polysilicon and the gate oxide to form a polysilicon gate pedestal positioned midway between two of said filled shallow trenches;

etching the silicon oxide until it has a surface that is co-planar with the silicon, whereby a groove is formed between the silicon oxide and the silicon;

implanting a first layer of donor ions into the silicon body;

growing a layer of pad oxide in said groove;

selectively depositing a layer of silicon nitride, whereby spacers are formed on all vertical surfaces of the pedestal and said layer of pad oxide in the groove becomes coated with silicon nitride;

implanting a second layer of donor ions, said second layer being deeper and more heavily doped than the first layer, thereby forming source and drain regions adjacent to the gate pedestal;

depositing a layer of a silicide forming metal;

rapidly thermally annealing the silicon body whereby said metal layer reacts to form its silicide wherever it is in direct contact with silicon; and selectively etching away all the un-reacted metal.

10. The process of claim 9 wherein the layer of pad oxide has a thickness between about 50 and 100 Angstroms.

11. The process of claim 9 wherein the layer of silicon nitride has a thickness between about 600 and 1,800 Angstroms.

12. The process of claim 9 wherein the trench has a width greater than about 0.2 microns.

13. The process of claim 9 wherein the trench has a depth between about 0.3 and 0.4 microns.

14. The process of claim 9 wherein the groove has a depth between about 500 and 1,000 Angstroms.

15. The process of claim 9 wherein the step of etching the dielectric material further comprises using 50:1 HF for 5 minutes at room temperature.

16. The process of claim 9 wherein the step of depositing a layer of silicon nitride further comprises using PECVD.

17. The process of claim 9 wherein said silicide forming metal is selected from the group consisting of cobalt, titanium, and tungsten.

18. The process of claim 9 wherein the step of the rapidly thermally annealing further comprises heating to a temperature between about 450 and 600° C. for between about 10 and 15 minutes.

19. The process of claim 9 wherein the trenches are separated one from another by a minimum distance of between about 0.2 and 0.3 microns.

20. The process of claim 9 wherein said gate pedestal has a width that is greater about 0.1 microns.

* * * * *